United States Patent
Saito et al.

(10) Patent No.: US 9,117,885 B2
(45) Date of Patent: Aug. 25, 2015

(54) GRAPHENE INTERCONNECTION AND METHOD OF MANUFACTURING THE SAME

(75) Inventors: Tatsuro Saito, Yokohama (JP); Makoto Wada, Yokohama (JP); Akihiro Kajita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 340 days.

(21) Appl. No.: 13/216,445

(22) Filed: Aug. 24, 2011

(65) Prior Publication Data

US 2012/0080662 A1 Apr. 5, 2012

(30) Foreign Application Priority Data

Oct. 5, 2010 (JP) .................. 2010-225776

(51) Int. Cl.
| | | |
|---|---|---|
| *H01L 21/00* | (2006.01) | |
| *H01L 21/768* | (2006.01) | |
| *H01L 21/285* | (2006.01) | |
| *H01L 23/522* | (2006.01) | |
| *H01L 23/532* | (2006.01) | |

(52) U.S. Cl.
CPC .... *H01L 21/76844* (2013.01); *H01L 21/28556* (2013.01); *H01L 21/76847* (2013.01); *H01L 21/76856* (2013.01); *H01L 21/76876* (2013.01); *H01L 21/76879* (2013.01); *H01L 21/76883* (2013.01); *H01L 23/522* (2013.01); *H01L 23/53276* (2013.01); *H01L 21/76834* (2013.01)

(58) Field of Classification Search
CPC .............. H01L 21/76846; H01L 29/1606; H01L 21/76877; H01L 21/76844; H01L 23/522; H01L 21/76876; H01L 21/76856; H01L 23/53276; H01L 21/28556; H01L 21/76879; H01L 21/76883; H01L 21/76847; H01L 21/76834
USPC .................................................. 257/750, 222
See application file for complete search history.

(56) References Cited

U.S. PATENT DOCUMENTS

| | | | |
|---|---|---|---|
| 8,358,008 B2 * | 1/2013 | Wada et al. ................... | 257/750 |
| 2008/0245553 A1 | 10/2008 | Sakai et al. | |
| 2009/0257270 A1 | 10/2009 | Schricker et al. | |
| 2011/0006425 A1 * | 1/2011 | Wada et al. ................... | 257/750 |
| 2011/0101528 A1 | 5/2011 | Akimoto et al. | |

FOREIGN PATENT DOCUMENTS

| | | |
|---|---|---|
| JP | 2006-120730 | 5/2006 |
| JP | 2009-070911 | 4/2009 |

OTHER PUBLICATIONS

Xu, Chuan, et al., "Modeling, Analysis, and Design of Graphene Nano-Ribbon Interconnects", IEEE Transactions on Electron Devices, vol. 56, No. 8, Aug. 2009, pp. 1567-1578.

(Continued)

*Primary Examiner* — Laura Menz
(74) *Attorney, Agent, or Firm* — White & Case LLP

(57) ABSTRACT

According to one embodiment, a graphene interconnection includes a first insulating film, a first catalyst film, and a first graphene layer. A first insulating film includes an interconnection trench. A first catalyst film is formed on the first insulating film on both side surfaces of the interconnection trench. A first graphene layer is formed on the first catalyst film on the both side surfaces of the interconnection trench, and including graphene sheets stacked in a direction perpendicularly to the both side surfaces.

12 Claims, 12 Drawing Sheets

(56) References Cited

OTHER PUBLICATIONS

Byung Jim Kang, et al., "Monolayer graphene growth on sputtered thin film platinum", Journal of Applied Physics, 106, 104309-1-6, 2009.

Taiwanese Office Action issued on Nov. 21, 2013 in corresponding Taiwanese Application No. 100133224, along with English translation.

Taiwanese Office Action dated Aug. 25, 2014 in corresponding Taiwanese Application No. 100133224, along with English translation thereof.

Taiwanese Office Action issued on May 21, 2015 in corresponding Taiwanese Application No. 100133224, along with English translation thereof.

* cited by examiner

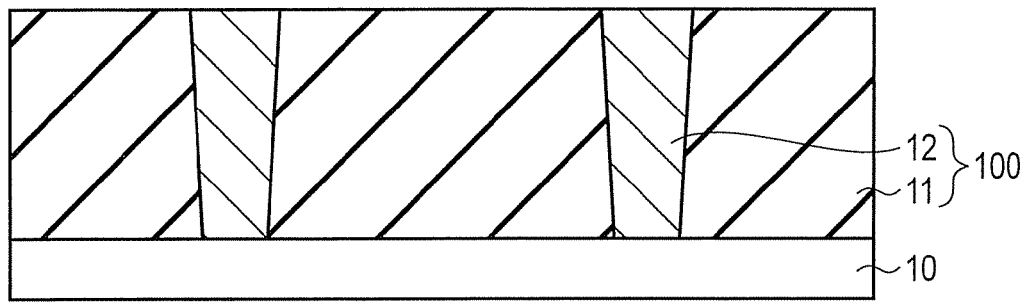
F I G. 2A
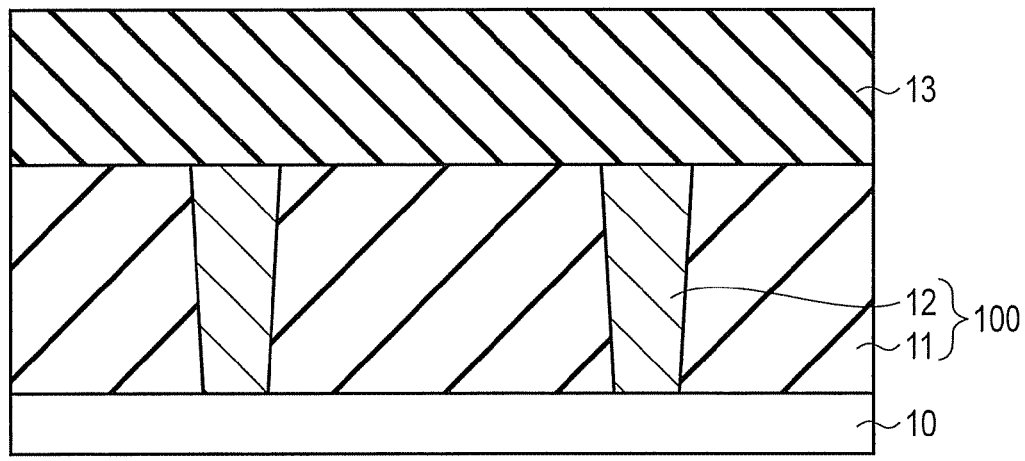
F I G. 2B

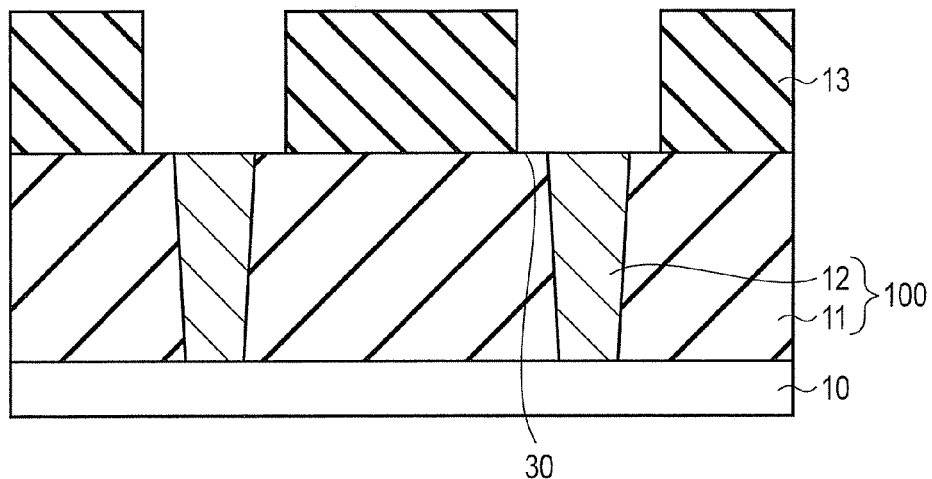
F I G. 3A
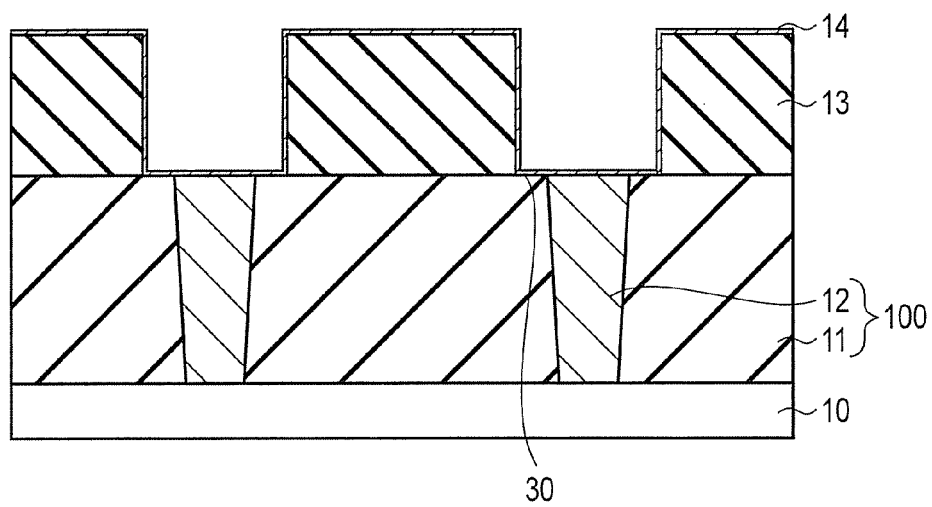
F I G. 3B

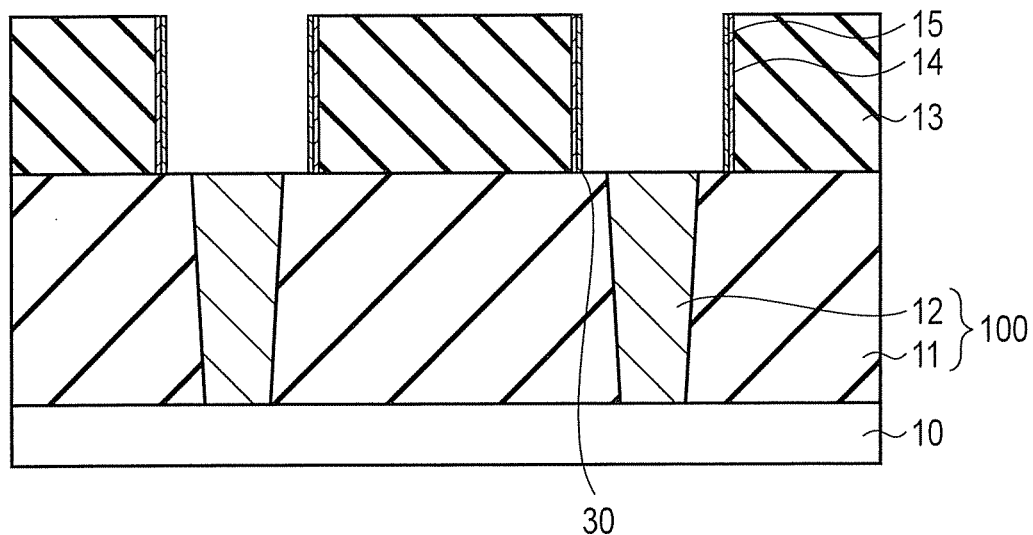
F I G. 5A
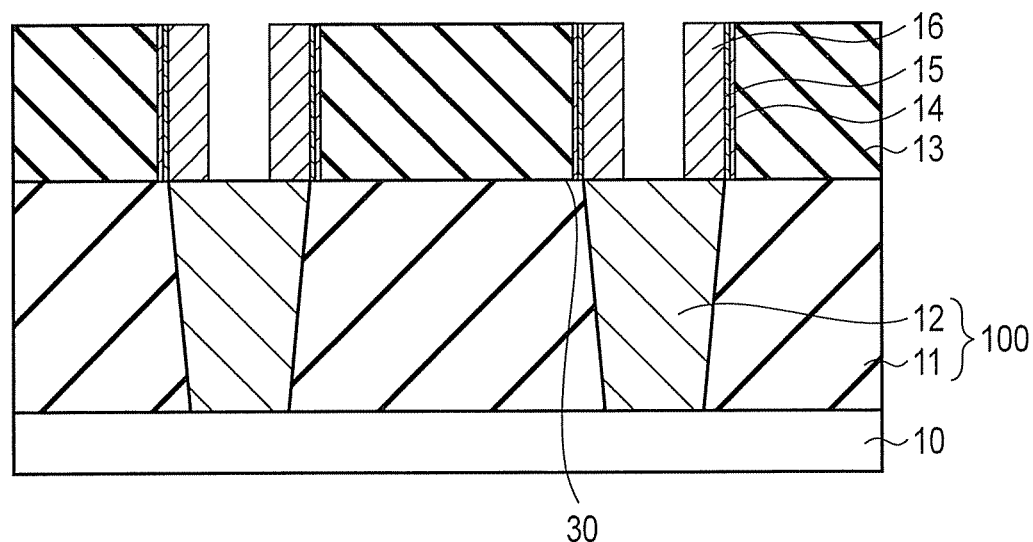
F I G. 5B

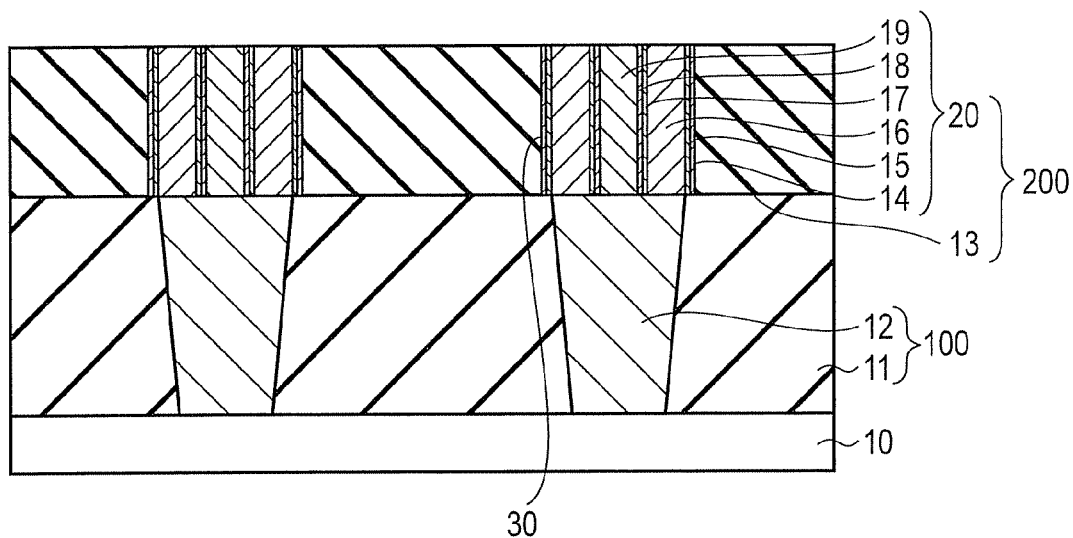
F I G. 6A
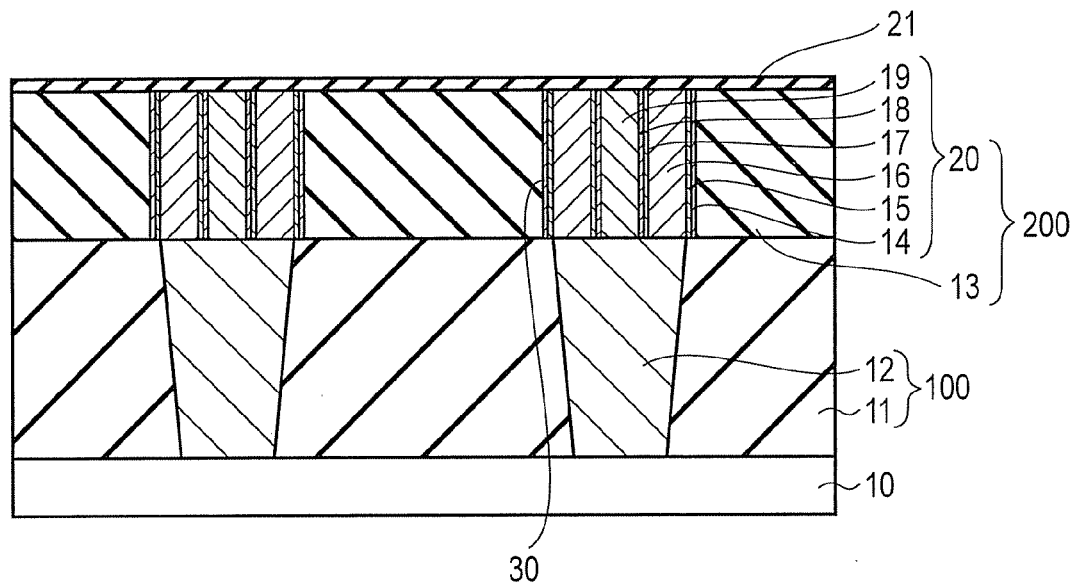
F I G. 6B

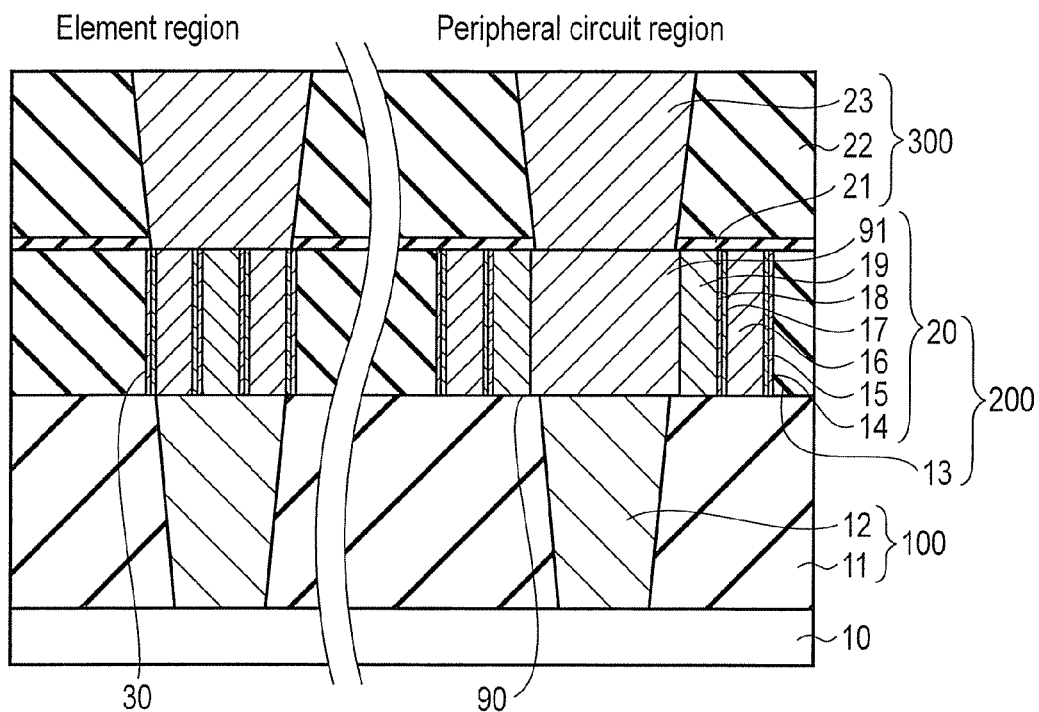
F I G. 9
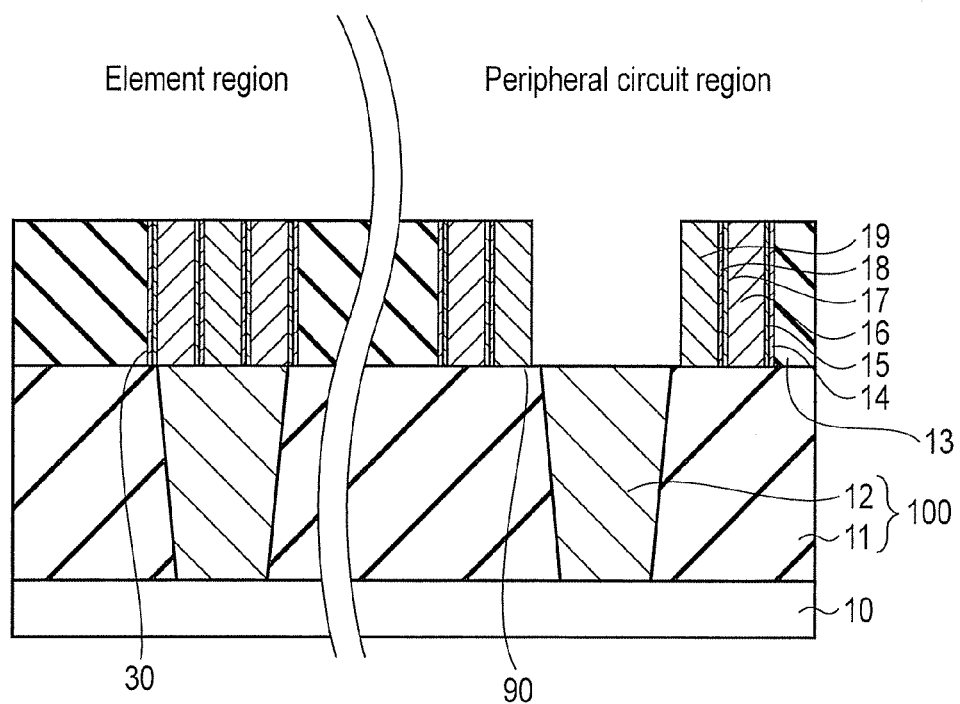
F I G. 10

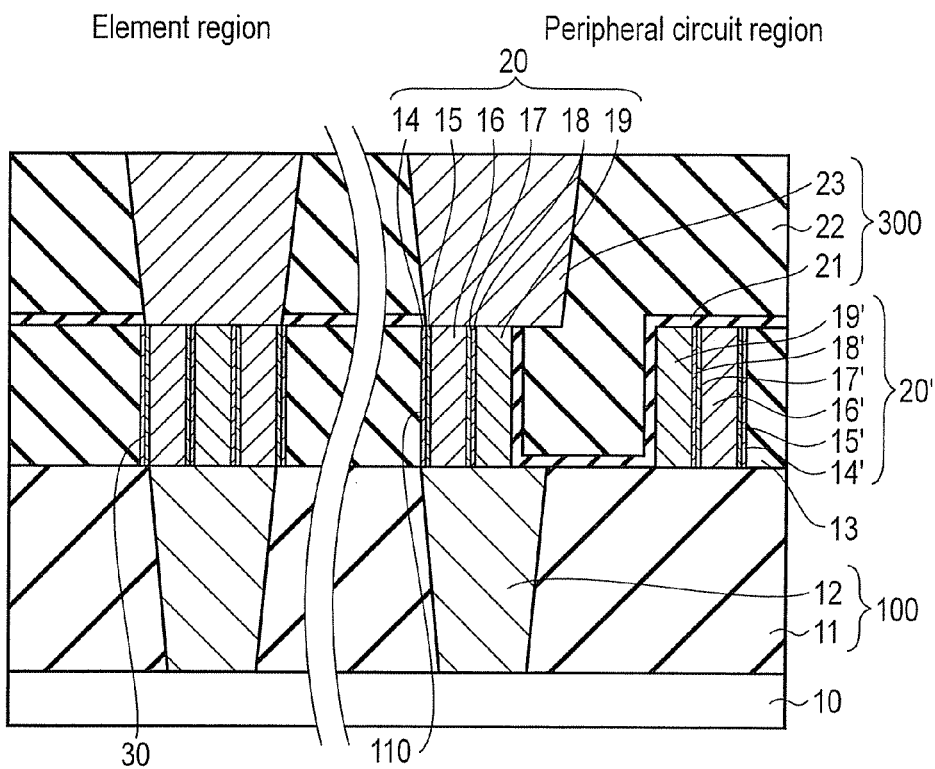
F I G. 11
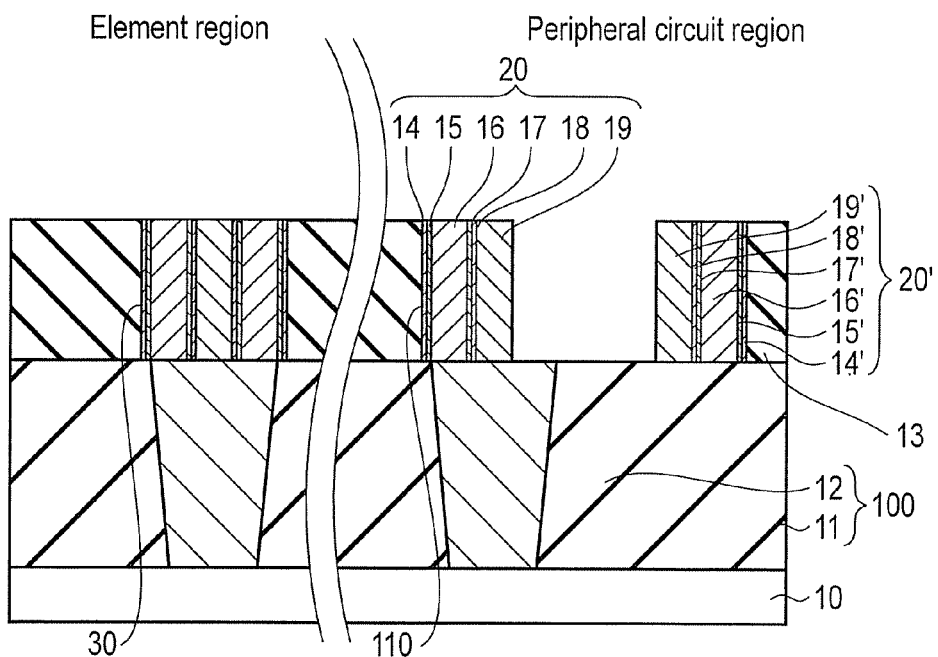
F I G. 12

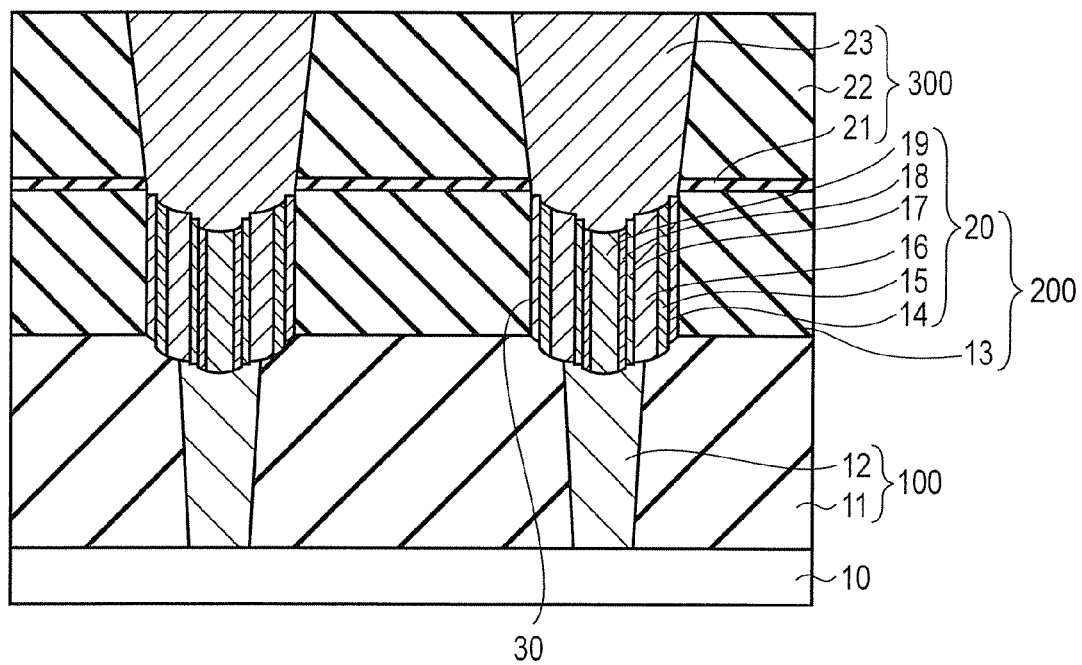
F I G. 13

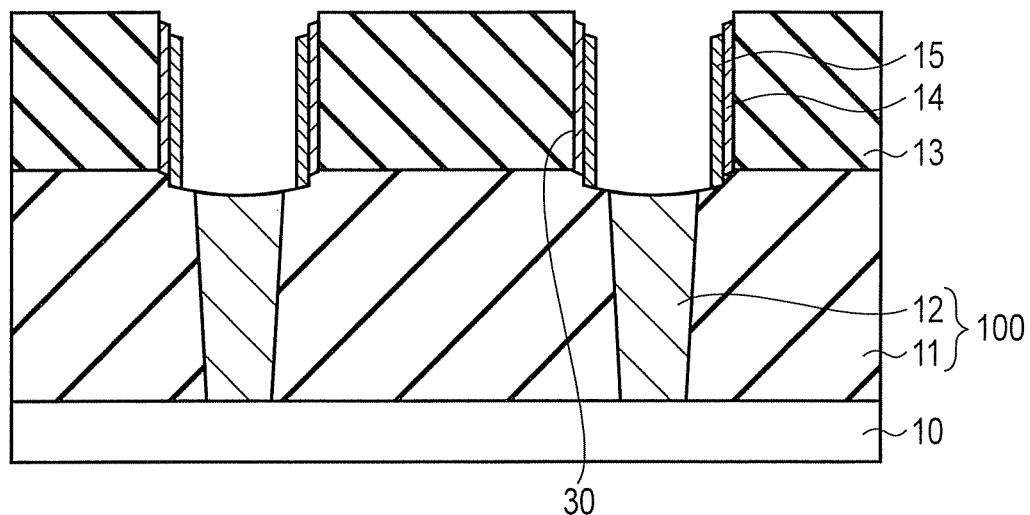
F I G. 14A
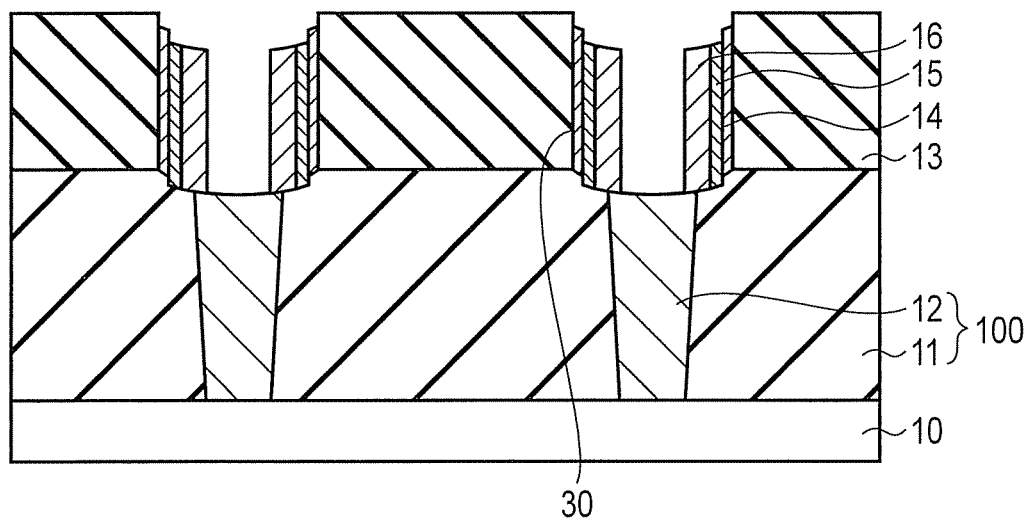
F I G. 14B

GRAPHENE INTERCONNECTION AND METHOD OF MANUFACTURING THE SAME

CROSS-REFERENCE TO RELATED APPLICATIONS

This application is based upon and claims the benefit of priority from prior Japanese Patent Application No. 2010-225776, filed Oct. 5, 2010, the entire contents of which are incorporated herein by reference.

FIELD

Embodiments described herein relate generally to a graphene interconnection and a method of manufacturing the same.

BACKGROUND

Recently, a method of applying a carbon-based material as a low-resistance material to an interconnection is extensively studied worldwide. A typical carbon-based material expected to have a low resistance is a carbon nanotube (CNT). The CNT achieves various quantum effects in accordance with the differences between various nanostructures, and can be formed into an insulator, semiconductor, or conductor. Especially when the CNT is formed as a conductor, quantum conduction (ballistic conduction) is expected. This makes the CNT usable as an ultra-low-resistance material replacing the existing metallic material (for example, a Cu interconnection). Also, the CNT can be expected to be advantageous for electrical conduction of a long-distance interconnection because the ballistic length is large.

Unfortunately, it is very difficult to uniformly grow the CNT in the lateral direction (in-plane direction). Therefore, the CNT cannot simply be used as an interconnection material in the in-plane direction. In addition, the CNT is difficult to bend. This makes it impossible to form, for example, an interconnection bending structure by using the CNT, and imposes a large limitation on the layout of patterns.

On the other hand, a method of applying graphene, as a material having a quantum conduction characteristic similar to that of the CNT, to an interconnection material is extensively studied. Graphene is a novel carbon material obtained by extremely thinning graphite. Accordingly, similar to the CNT, graphene is expected to be used as an LSI low-resistance interconnection replacing a metal interconnection due to quantum conduction. Also, graphene has a very large ballistic length, and hence is advantageous for electrical conduction of a long-distance interconnection. Furthermore, since a graphene structure itself is a very thin film (single-layered film), the film can be deposited by chemical vapor deposition (CVD). That is, graphene well matches the formation process of lateral interconnections of devices.

The resistance of a graphene interconnection is determined by the quantum resistance per graphene sheet, and the number of stacked graphene sheets. That is, the resistance increases when the number of stacked graphene sheets is small, and decreases when the number of stacked graphene sheets is large. However, if the number of stacked graphene sheets becomes too large, the interaction between the graphene sheets increases, the mobility of carriers decreases, and the resistance increases.

In addition, since the bond between graphene sheets is different from that in the plane of a graphene sheet, electrical conduction between graphene sheets may be different from that in the plane of a graphene sheet. That is, electrical conduction between graphene sheets may have a resistance higher than that of electrical conduction in the plane of a graphene sheet.

As described above, demands have arisen for a further decrease in resistance of the graphene interconnection.

BRIEF DESCRIPTION OF THE DRAWINGS

FIGS. 2A-6B are sectional views showing the manufacturing steps of a graphene interconnection according to the first embodiment;

FIG. 9 is a sectional view showing the structure of a graphene interconnection according to the second embodiment;

FIG. 10 is a sectional view showing the manufacturing step of the graphene interconnection according to the second embodiment;

FIG. 11 is a sectional view showing the structure of a graphene interconnection according to the third embodiment;

FIG. 12 is a sectional view showing the manufacturing step of the graphene interconnection according to the third embodiment;

FIG. 13 is a sectional view showing the structure of a graphene interconnection according to the fourth embodiment; and FIGS. 14A and 14B are sectional views showing the manufacturing steps of the graphene interconnection according to the fourth embodiment.

DETAILED DESCRIPTION

Figure 1A:
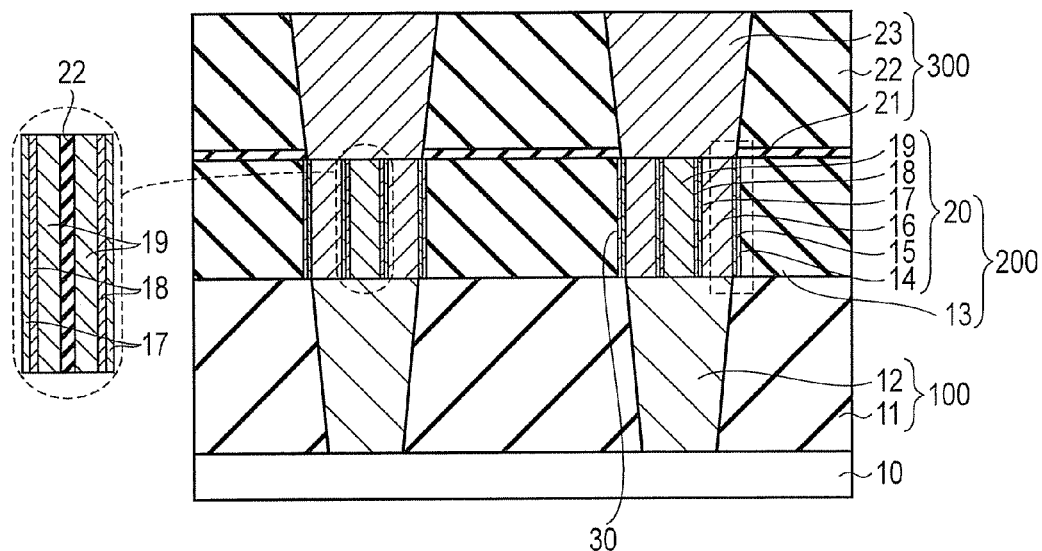
FIGS. 1A and 1B are sectional views showing the structure of a graphene interconnection according to the first embodiment.

In general, according to one embodiment, a graphene interconnection comprises: a first insulating film; a first catalyst film; and a first graphene layer. The first insulating film includes an interconnection trench. The first catalyst film is formed on the first insulating film on the both side surfaces of the interconnection trench. The first graphene layer is formed on the first catalyst film on the both side surfaces of the interconnection trench, and includes a plurality of graphene sheets stacked in a direction perpendicularly to the both side surfaces.

Embodiments will be explained below with reference to the accompanying drawing. In the drawing, the same reference numbers denote the same parts.

<First Embodiment>

A graphene interconnection according to the first embodiment will be explained below with reference to FIGS. 1A to 6A, and 6B. The first embodiment is an example in which a plurality of graphene sheets are stacked as interconnections perpendicularly to the side surfaces of an interconnection trench.

[Structure]

Figure 1B:
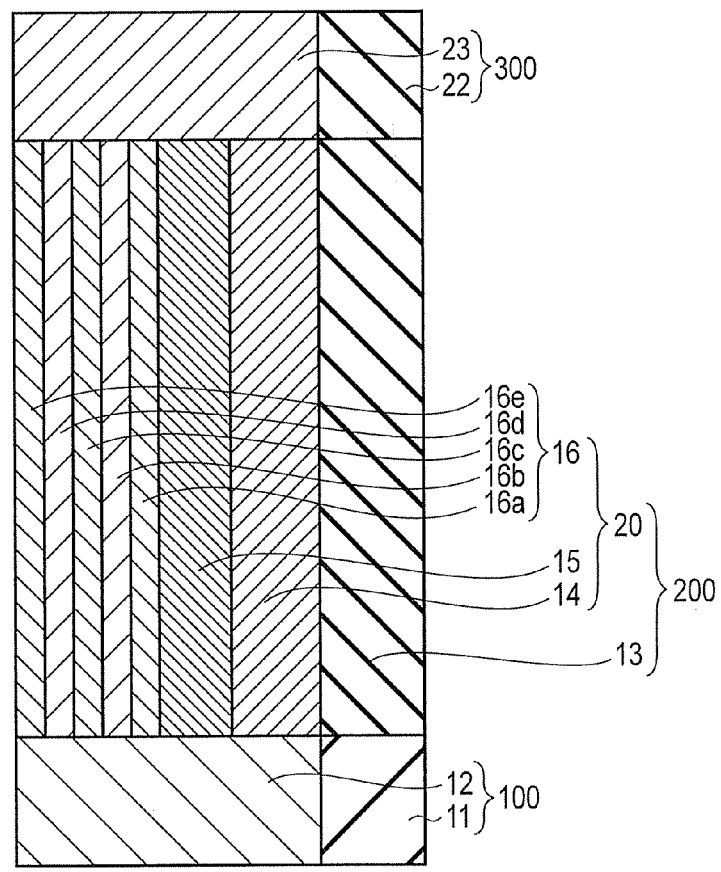

FIG. 1A is a sectional view of the graphene interconnection and FIG. 1B is an enlarged view of a dotted-line portion shown in FIG. 1A. Note that a cap film 21 (described later) is not shown in FIG. 1B.

As shown in FIG. 1A, as an example of an interconnection structure, a first contact layer 100, interconnection layer 200, and second contact layer 300 are formed on a substrate 10 in which a semiconductor element (not shown) such as a transistor or capacitor is formed.

The first contact layer 100 is formed on the substrate 10. The first contact layer 100 includes a first contact layer insulating film 11 and first contact plugs 12.

The first contact layer insulating film 11 is formed on the substrate 10 by using, for example, tetraethoxysilane (TEOS). The first contact plug 12 is formed in the first contact layer insulating film 11, and electrically connects the semiconductor element formed in the substrate 10 and the interconnection layer 200 (described later). The conductive material of the first contact plug 12 is a metal such as W, Cu, or Al.

To prevent the diffusion of the conductive material metal of the first contact plug 12, it is also possible to form a barrier metal (not shown) between the first contact plug 12 and the first contact layer insulating film 11 and substrate 10. The barrier metal is, for example, Ta, Ti, Ru, Mn, or Co, or a nitride of any of these metals. In addition, a stopper film (not shown) is formed on the contact layer 100 by using a material such as SiCN having a high processing selectivity to an interconnection layer insulating film 13. Note that no stopper film need be formed if the processing selectivity between the interconnection layer insulating film 13 (described later) and first contact layer insulating film 11 is sufficiently high.

The interconnection layer 200 is formed on the first contact layer 100. The interconnection layer 200 includes the interconnection layer insulating film 13 and interconnections 20.

The interconnection layer insulating film 13 is formed on the first contact layer 100 by using, for example, SiOC. A plurality of interconnection trenches 30 are formed in the interconnection layer insulating film 13 so as to open the portions of the first contact plugs 12. The interconnection layer insulating film 13 may also be a film including pores (microscopic hollows) in order to decrease the dielectric constant.

The interconnection 20 is formed along each interconnection trench 30 formed in the interconnection layer insulating film 13. Details of the interconnection 20 will be described later.

The cap film 21 as a protective film is formed on the interconnection layer insulating film 13. The cap film 21 is, for example, SiN or SiCN, and has holes in regions where second contact plugs 23 (described later) are to be formed. The cap film 21 prevents the diffusion of the material forming the interconnection layer 200 to the outside, and prevents the oxidation of the material forming the interconnection layer 200. However, the cap film 21 need not always be formed because a graphene layer (described later) itself is a stable material and has a high oxidation resistance. The cap film 21 can also function as a control layer for etching processing of the second contact layer 300.

The second contact layer 300 is formed on the interconnection layer 200. The second contact layer 300 has the same structure as that of the first contact layer 100, and includes a second contact layer insulating film 22 and the second contact plugs 23.

The second contact layer insulating film 22 is formed on the cap film 21 on the interconnection layer 200 by using, for example, TEOS. The second contact plug 23 is formed in the second contact layer insulating film 22, and electrically connects the interconnection layer 200 and an interconnection layer (not shown) formed on the second contact layer 300.

The interconnection 20 according to this embodiment will be explained below. The interconnection 20 according to this embodiment is formed in each interconnection trench 30, and includes first catalyst underlying films 14, first catalyst films 15, first graphene layers 16, second catalyst underlying films 17, second catalyst films 18, and a second graphene layer 19.

Note that in FIG. 1A, the interconnection 20 extends in the direction perpendicular to the drawing surface, and an electric current flows in the direction.

The first catalyst underlying films 14 are formed on the both side surfaces of each interconnection trench 30. More specifically, the first catalyst underlying films 14 are formed on the interconnection layer insulating film 13 on the both side surfaces of each interconnection trench 30. Also, the end portion (lower portion in FIG. 1A) of each first catalyst underlying film 14 may be in contact with the first contact plug 12 as the bottom surface of the interconnection trench 30. The first catalyst underlying films 14 are formed on only the interconnection layer insulating film 13 on the both side surfaces. Also, each first catalyst underlying film 14 functions as an auxiliary film for facilitating the formation of the first graphene layer 16 (described later). Furthermore, the first catalyst underlying film 14 prevents the diffusion of the first catalyst film 15 (described later) to the interconnection layer insulating film 13. That is, the first catalyst underlying film 14 is a film having an auxiliary catalytic action and diffusion barrier properties.

The first catalyst underlying film 14 is a film containing, for example, TaN, TiN, RuN, WN, Ta, Ti, Ru, or W, or a film of an oxide of any of these materials. It is also possible to stack films of these materials as the first catalyst underlying film 14. In particular, to promote the uniform growth of the first graphene layer 16, the first catalyst underlying film 14 is desirably a multilayered film of a TaN film and TiN film. The first catalyst underlying film 14 has a film thickness of, for example, about 1 nm, and is desirably a continuous film in order to uniformly grow the first graphene layer 16. Also, the film thicknesses of the first catalyst underlying films 14 on the both side surfaces are preferably equal. Note that the first catalyst underlying film 14 is desirably deposited to facilitate the formation of the first graphene layer 16, but need not always be deposited because the first graphene layer 16 can be grown without the first catalyst underlying film 14.

The first catalyst films 15 are formed on the both side surfaces of each interconnection trench 30, like the first catalyst underlying films 14. More specifically, the first catalyst films 15 are formed on the first catalyst underlying films 14 on the both side surfaces of each interconnection trench 30. Also, the end portion (lower portion in FIG. 1A) of each first catalyst film 15 may be in contact with the first contact plug 12 as the bottom surface of the interconnection trench 30. The first catalyst film 15 is a main catalyst for growing the first graphene layer 16.

The first catalyst film 15 is desirably a film containing a metal such as Co, Ni, Fe, Ru, or Cu, a film of an alloy containing at least one of these metals, or a film of, for example, a carbide of any of these metals. If the first catalyst film 15 disperses into fine grains (a discontinuous film), the first graphene layer 16 cannot well grow or may discontinuously be formed. Therefore, the first catalyst film 15 is desirably a continuous film. For this purpose, the film thickness of the first catalyst film 15 must be at least 0.5 nm, and is, for example, about 1 nm.

The first graphene layers 16 are formed on the first catalyst films 15 on the both side surfaces of each interconnection trench 30. Each first graphene layer 16 is continuously formed in the direction perpendicular to the drawing surface, and an electron transfer path (current path) is formed along the direction. Also, as will be described later, the first graphene layer 16 includes up to about 100 graphene sheets that grow by using the first catalyst film 15 as a catalyst, and has a quantum conduction characteristic. Graphene is a single-layered film of graphite, and has a structure in which carbon atoms are arranged into a hexagonal lattice shape. In the following description, graphene as a single-layered film of graphite will be referred to as a graphene sheet. The interconnection 20 is extended toward in a direction perpendicular to the sheet surface of FIG. 1A.

The mean free path of electrons in the graphene sheet is about 100 nm to 1 μm, and much longer than the mean free path (about 40 nm) of electrons in Cu as a low-resistance metal presently used in many LSI devices. Accordingly, the graphene sheet can be used as a low-resistance material in a conductive layer of the interconnection 20.

As shown in FIG. 1B, the first graphene layer 16 includes a plurality of graphene sheets 16a to 16e stacked on the first catalyst film 15 on the side surface of the interconnection trench 30 in the direction perpendicular to the side surface. In other words, the surfaces of the plurality of graphene sheets 16a to 16e are formed parallel to the side surface of the interconnection trench 30 and perpendicularly to the bottom surface. Therefore, the lower end portions of the surfaces of the plurality of graphene sheets 16a to 16e are directly connected to the first contact plug 12, and the upper end portions are directly connected to the second contact plug 23. Accordingly, all the graphene sheets having the lower end portions in contact with the first contact plug 12 can contribute to electrical conduction. Note that when the first graphene layer 16 includes 10 graphene sheets, the film thickness of the first graphene layer 16 is about 3.4 nm.

The second catalyst underlying films 17 are formed on the both side surfaces of each interconnection trench 30. More specifically, the second catalyst underlying films 17 are formed on the first graphene layers 16 on the both side surfaces of each interconnection trench 30. The end portion (lower portion in FIG. 1A) of each second catalyst underlying film 17 may be in contact with the first contact plug 12 as the bottom surface of the interconnection trench 30. The second catalyst underlying film 17 functions as an auxiliary film for facilitating the formation of the second graphene layer 19 (described later).

The second catalyst underlying film 17 has the same properties and structure as those of the first catalyst underlying film 14. That is, the second catalyst underlying film 17 is a film containing, for example, TaN, TiN, RuN, WN, Ta, Ti, Ru, or W, or a film of an oxide of any of these materials. It is also possible to stack films of these materials as the second catalyst underlying film 17. In particular, to promote the uniform growth of the second graphene layer 19, the second catalyst underlying film 17 is desirably a multilayered film of a TaN film and TiN film. The second catalyst underlying film 17 has a film thickness of, for example, about 1 nm, and is desirably a continuous film in order to uniformly grow the second graphene layer 19. Note that the second catalyst underlying film 17 is desirably deposited to facilitate the formation of the second graphene layer 19, but need not always be deposited because the second graphene layer 19 can be grown without the second catalyst underlying film 17.

The second catalyst films 18 are formed on the both side surfaces of each interconnection trench 30. More specifically, the second catalyst films 18 are formed on the second catalyst underlying films 17 on the both side surfaces of each interconnection trench 30, like the second catalyst underlying films 17. Also, the end portion (lower portion in FIG. 1A) of each second catalyst film 18 may be in contact with the first contact plug 12 as the bottom surface of the interconnection trench 30. The second catalyst film 18 is a main catalyst for growing the second graphene layer 19.

The second catalyst film 18 has the same properties and structure as those of the first catalyst film 15. That is, the second catalyst film 18 is desirably a film of a metal such as Co, Ni, Fe, Ru, or Cu, a film of an alloy containing at least one of these metals, or a film of, for example, a carbide of any of these metals. If the second catalyst film 18 disperses into fine grains (a discontinuous film), the second graphene layer 19 cannot well grow or may discontinuously be formed. Therefore, the second catalyst film 18 is desirably a continuous film. For this purpose, the film thickness of the second catalyst film 18 must be at least 0.5 nm, and is, for example, about 1 nm.

The second graphene layer 19 is formed on the second catalyst films 18 on the both side surfaces of each interconnection trench 30. The second graphene layer 19 has the same properties and structure as those of the first graphene layer 16. That is, the second graphene layer 19 is continuously formed in the direction perpendicular to the drawing surface, and an electron transfer path is formed along this direction. Also, the second graphene layer 19 includes up to about 100 graphene sheets that grow by using the second catalyst films 18 as catalysts, and has a quantum conduction characteristic.

The second graphene layer 19 is formed in the central portion of the interconnection trench 30. That is, the second graphene layer 19 has a structure in which the graphene sheets grow from the second catalyst films 18 on the both side surfaces, fill the interconnection trench 30, and unite in the central portion. More specifically, the second graphene layer 19 includes, for example, about five graphene sheets stacked from the second catalyst film 18 on each side surface, that is, includes a total of about 10 stacked graphene sheets.

Note that FIG. 1A shows the structure in which the interconnection 20 includes the three graphene layers (two first graphene layers 16 and one second graphene layer 19), but the interconnection 20 may include four or more graphene layers. Note also that as indicated by a dotted-line portion in FIG. 1A, the central portion of the interconnection trench 30 need not be filled with the graphene layer, and may be filled with the cap layer 21 or second contact layer insulating film 22 to be formed later.

Furthermore, although FIG. 1A shows the structure including one interconnection layer, two or more interconnection layers may be formed. That is, an interconnection layer similar to the interconnection layer 200 including a plurality of graphene layers may be formed on the second contact layer 300.

[Manufacturing Method]

FIGS. 2A to 6B are sectional views of the manufacturing steps of the graphene interconnection according to the first embodiment.

First, as shown in FIG. 2A, a first contact layer 100 is formed on a substrate 10 in which a semiconductor element (not shown) is formed. More specifically, a first contact layer insulating film 11 is formed on the substrate 10 by, for example, chemical vapor deposition (CVD), and contact holes (not shown) are formed in the first contact layer insulating film 11 by, for example, lithography. First contact plugs 12 are buried in these contact holes by, for example, CVD. In this step, a barrier metal (not shown) may be formed on the surface of each contact hole in order to prevent the diffusion of a metal as the conductive material of the first contact plug 12.

Then, a stopper film (not shown) is formed on the first contact layer 100 by, for example, CVD. This stopper film uniformizes the depth of processing of an interconnection layer insulating film 13 by reactive ion etching (RIE). Note that when the processing selectivity between the interconnection layer insulating film 13 and first contact layer 100 is sufficiently high, it is possible to sufficiently control the depth of processing of the interconnection layer insulating film 13 without any stopper film.

Subsequently, as shown in FIG. 2B, the interconnection layer insulating film 13 is formed on the first contact layer 100 by, for example, CVD. A cap film (not shown) serving as a protective film against damage in an RIE step and chemical mechanical polishing (CMP) step may be formed on the interconnection layer insulating film 13. No cap film need be formed if the interconnection layer insulating film 13 is a film highly resistant to damage by RIE, for example, one of TEOS, or of SiOC not including pores (microscopic hollows).

As shown in FIG. 3A, the interconnection layer insulating film 13 is coated with a resist (not shown), and a lithography step is performed. After that, interconnection trenches 30 are formed in the interconnection layer insulating film 13 by RIE, thereby forming a single-damascene interconnection structure.

As shown in FIG. 3B, a first catalyst underlying film 14 is formed on the entire surface by, for example, CVD or physical vapor deposition (PVD). That is, the first catalyst underlying film 14 is formed on the first contact layer 100 as the bottom surface of each interconnection trench 30, on the interconnection layer insulating film 13 on the both side surfaces of each interconnection trench 30, and on the interconnection layer insulating film 13 on the upper surface outside the interconnection trenches 30 (a flat portion except for the interconnection trenches 30). Note that the first catalyst underlying film 14 need not always be formed.

Figure 4A:
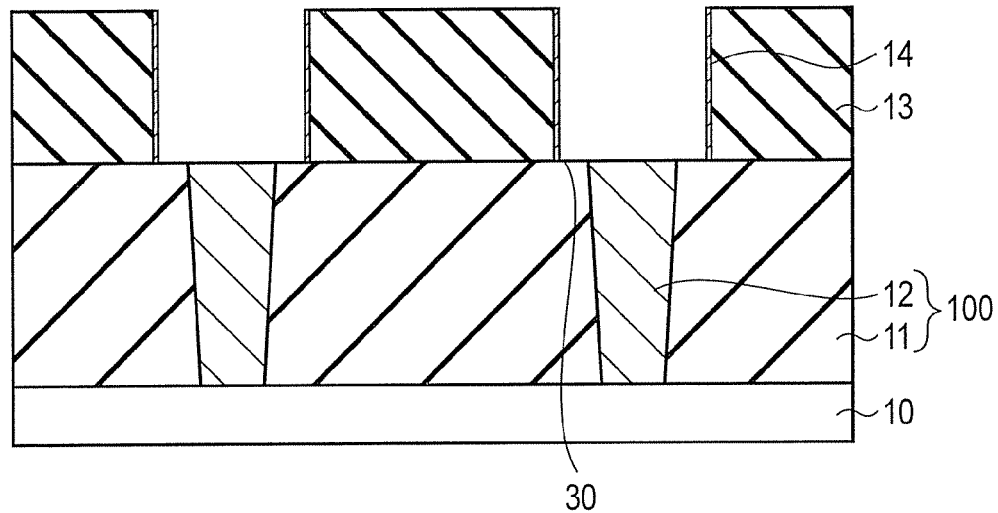

As shown in FIG. 4A, etch back is performed by highly translational (anisotropic) RIE. Consequently, the first catalyst underlying film 14 on the bottom surface of each interconnection trench 30 and on the upper surface outside the interconnection trenches 30 is etched back. That is, the first catalyst underlying film 14 is removed from the bottom surface of each interconnection trench 30 and the upper surface outside the interconnection trenches 30, and left behind on only the both side surfaces of each interconnection trench 30.

Figure 4B:
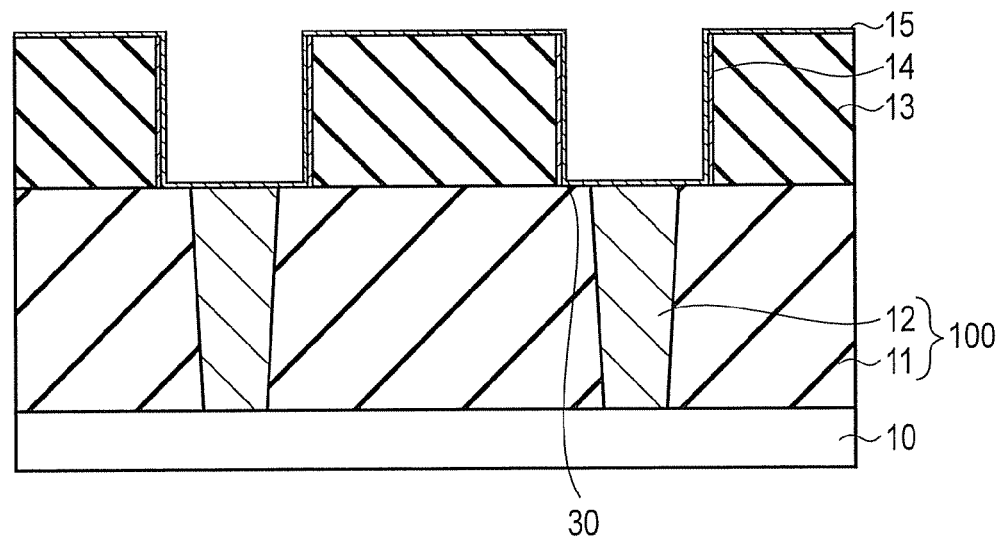

As shown in FIG. 4B, a first catalyst film 15 is formed on the entire surface by, for example, CVD, PVD, or spraying. That is, the first catalyst film 15 is formed on the first contact layer 100 as the bottom surface of each interconnection trench 30, on the first catalyst underlying film 14 on the side surface of each interconnection trench 30, and on the interconnection layer insulating film 13 on the upper surface outside the interconnection trenches 30. The first catalyst film 15 is desirably formed as a continuous film.

As shown in FIG. 5A, etch back is performed by highly translational (anisotropic) RIE. Consequently, the first catalyst film 15 on the bottom surface of each interconnection trench 30 and on the upper surface outside the interconnection trenches 30 is etched back. That is, the first catalyst film 15 is removed from the bottom surface of each interconnection trench 30 and the upper surface outside the interconnection trenches 30, and left behind on only the both side surfaces of each interconnection trench 30.

Note that after the first catalyst underlying film 14 and first catalyst film 15 are formed, it is also possible to perform etch back by highly translational (anisotropic) RIE, thereby simultaneously removing the first catalyst underlying film 14 and first catalyst film 15 from the bottom surface of each interconnection trench 30 and the upper surface outside the interconnection trenches 30.

As shown in FIG. 5B, first graphene layers 16 each including up to about 100 graphene sheets are formed on the first catalyst films 15 on the both side surfaces of each interconnection trench 30. Since the first catalyst films 15 are formed on only the both side surfaces of each interconnection trench 30, the first graphene layers 16 grow perpendicularly from the both side surfaces of the interconnection trench 30. That is, the first graphene layers 16 each include a plurality (up to about 100) of graphene sheets stacked in a direction perpendicularly to the side surface, and the surfaces of these graphene sheets are parallel to the side surface of the interconnection trench 30 and perpendicular to the bottom surface. Also, the lower end portions of the surfaces of the plurality of graphene sheets are directly connected to the first contact plug 12.

The first graphene layers 16 are formed by, for example, CVD. A hydrocarbon gas such as methane or acetylene or a mixture containing these gases is used as a carbon source of CVD, and hydrogen or a rare gas is used as a carrier gas.

Graphene sheets can be grown by CVD under the same conditions by using these component gases, and can also be grown by multistage processing. The growth of graphene sheets by the multistage processing will be explained below.

First, before forming the first graphene layers 16, plasma processing is performed on the first catalyst films 15 in order to suppress the aggregation of the first catalyst films 15 into fine grains. The uniform growth of the first graphene layer 16 can be promoted by thus preventing the formation of fine grains of the first catalyst film 15, thereby maintaining the continuity of the surface of the first catalyst film 15. Although hydrogen or a rare gas is desirably used as a discharge gas, it is also possible to use a gaseous mixture containing one or both of hydrogen and a rare gas. The processing temperature is preferably as low as possible in order to increase the effect, and desirably room temperature. The plasma is desirably relatively intense, and exposure to a high-power remote plasma or plasma further increases the effect.

Then, the first catalyst films 15 are carbonized by using a hydrocarbon gas such as methane or a gaseous mixture containing a hydrocarbon as a discharge gas. The processing temperature must be a temperature which is lower than the formation temperature of graphene sheets in a final step (described later) and at which graphene sheets can be formed. For example, the processing temperature is desirably about 150 to 600° C. Also, the processing time can be short. This processing is also desirably performed by using a relatively intense plasma.

Subsequently, plasma processing is performed on the first catalyst films 15 in order to improve the quality of the carbonized layers and activate the catalyst. A rare gas is desirably used as a discharge gas. The processing temperature can be an intermediate temperature between the processing temperature in the preceding step and that in the succeeding step, but is not limited to this. Since a relatively weak plasma can be used in this processing, the processing is desirably performed using a remote plasma.

Finally, graphene sheets are formed by using a hydrocarbon gas or a gaseous mixture of a hydrocarbon as a discharge gas. The upper limit of the processing temperature is about 1,000° C., and the lower limit is about 200° C. If the processing temperature is lower than 200° C., a necessary growth rate cannot be obtained, so almost no graphene sheet growth occurs. At a temperature of 200° C. or higher, the growth of graphene sheets occurs, and a uniform graphene layer 16 is formed. For this purpose, the processing temperature is particularly desirably about 350° C. The processing temperature of the graphene sheet formation as described above is less than or equal to the temperature of an interconnection formation step of a normal LSI device. Accordingly, the above-described graphene sheet formation has high affinity for a semiconductor process.

In this processing, it is important to remove ions and electrons and supply only radicals to the substrate. Therefore, the use of a very weak remote plasma is desirable. It is also effective to provide an electrode on the substrate and apply a voltage in order to remove ions and electrons. This application voltage is desirably about 0 to ±100 V.

Compared to the graphene sheet formation step performed under the same conditions by CVD, the graphene sheet formation step performed by the multistage processing as described above can achieve a low formation temperature and high quality (uniform growth). The upper limit of the process temperature is preferably as low as possible, although it depends on an LSI device. That is, the overall characteristics of an LSI device can be improved by decreasing the graphene sheet formation temperature. Also, the achievement of high quality (uniform growth) of graphene sheets facilitates electrical conduction, and can implement a low-resistance interconnection.

Then, as shown in FIG. 6A, the steps shown in FIGS. 3B to 5B are repeated.

More specifically, a second catalyst underlying film 17 is first formed on the entire surface by, for example, CVD or PVD. That is, the second catalyst underlying film 17 is formed on the first contact layer 100 as the bottom surface of each interconnection trench 30, on the first graphene layers 16 on the both side surfaces of each interconnection trench 30, and on the upper surface outside the interconnection trenches 30. After that, etch back is performed by highly translational (anisotropic) RIE. Consequently, the second catalyst underlying film 17 on the bottom surface of each interconnection trench 30 and on the upper surface outside the interconnection trenches 30 is etched back. That is, the second catalyst underlying film 17 is removed from the bottom surface of each interconnection trench 30 and the upper surface outside the interconnection trenches 30, and left behind on only the both side surfaces of each interconnection trench 30.

Then, a second catalyst film 18 is formed on the entire surface by, for example, CVD, PVD, or spraying. That is, the second catalyst film 18 is formed on the first contact layer 100 as the bottom surface of each interconnection trench 30, on the second catalyst underlying films 17 on the both side surfaces of each interconnection trench 30, and on the upper surface outside the interconnection trenches 30. After that, etch back is performed by highly translational (anisotropic) RIE. Consequently, the second catalyst film 18 on the bottom surface of each interconnection trench 30 and on the upper surface outside the interconnection trenches 30 is etched back. That is, the second catalyst film 18 is removed from the bottom surface of each interconnection trench 30 and the upper surface outside the interconnection trenches 30, and left behind on only the both side surfaces of each interconnection trench 30.

Subsequently, a second graphene layer 19 including up to about 100 graphene sheets is formed on the second catalyst films 18 on the both side surfaces of each interconnection trench 30. The second graphene layer 19 is formed by the same method as that for the first graphene layers 16. Since the second catalyst films 18 are formed on only the both side surfaces of each interconnection trench 30, the second graphene layer 19 grows perpendicularly from the both side surfaces of the interconnection trench 30. That is, the second graphene layer 19 includes a plurality (up to about 100) of graphene sheets stacked in a direction perpendicularly to the both side surfaces, and the surfaces of these graphene sheets are parallel to the side surfaces of the interconnection trench 30, and perpendicular to the bottom surface. Also, the lower end portions of the surfaces of the plurality of graphene sheets are directly connected to the first contact plug 12.

The second graphene layer 19 has a structure in which the graphene sheets grow from the second catalyst films 18 on the both side surfaces, fill the interconnection trench 30, and unite in the central portion.

Thus, an interconnection layer 200 including interconnections 20 each including the first catalyst underlying films 14, first catalyst films 15, first graphene layers 16, second catalyst underlying films 17, second catalyst films 18, and second graphene layer 19 is formed.

Then, as shown in FIG. 6B, a cap film 21 for preventing the diffusion of the material forming the interconnection layer 200 to the outside and preventing the oxidation of the material forming the interconnection layer 200 is formed on it. The cap film 21 also functions as a control layer for etching processing of a second contact layer 300. Note that the cap film 21 need not always be formed.

Subsequently, as shown in FIG. 1A, the second contact layer 300 is formed on the interconnection layer 200. More specifically, a second contact layer insulating film 22 is formed on the interconnection layer 200 by, for example, CVD, and contact holes (not shown) are formed in the second contact layer insulating film 22 by, for example, lithography. In this step, holes are also formed in the cap film 21 in regions where the contact holes are to be formed. A second contact plug 23 is buried in each contact hole by, for example, CVD. To prevent the diffusion of a metal of the conductive material of the second contact plug 23, a barrier metal (not shown) can also be formed on the surface of the contact hole.

Thus, the graphene interconnection according to this embodiment is formed.

In the above-mentioned first embodiment, the interconnection 20 includes the plurality of graphene layers (two first graphene layers 16 and one second graphene layer 19), and each graphene layer includes the plurality of graphene sheets stacked in a direction perpendicularly to the both side surfaces of the interconnection trench 30, and having surfaces whose end portions are directly connected to the contact plugs (first contact plug 12 and second contact plug 23). Therefore, all the graphene sheets having the surfaces whose end portions are directly connected to the contact plugs can contribute to electrical conduction, so a low-resistance interconnection structure can be implemented.

Also, each graphene layer includes up to about 100 graphene sheets. This makes it possible to solve the problem of a high resistance caused by the interaction that occurs between graphene sheets when too many graphene sheets are stacked. That is, all the graphene layers can have the quantum conduction characteristic. Accordingly, by filling each interconnection trench 30 with the plurality of graphene layers having the quantum conduction characteristic, it is possible to increase the absolute number of graphene sheets (number of stacked sheets) serving as electrical conduction paths without the problem of a high resistance caused by the interaction between graphene sheets, and implement an interconnection structure having a lower resistance.

[Modification]

A modification of the graphene interconnection according to the first embodiment will be explained below with reference to FIGS. 7A to 8B.

FIGS. 7A to 8B are sectional views of manufacturing steps in the modification of the graphene interconnection according to the first embodiment.

First, the manufacturing steps are performed up to the step shown in FIG. 6A. That is, an interconnection layer 200 including interconnections 20 each including first catalyst underlying films 14, first catalyst films 15, first graphene layers 16, second catalyst underlying films 17, second catalyst films 18, and a second graphene layer 19 is formed.

Figure 7A:
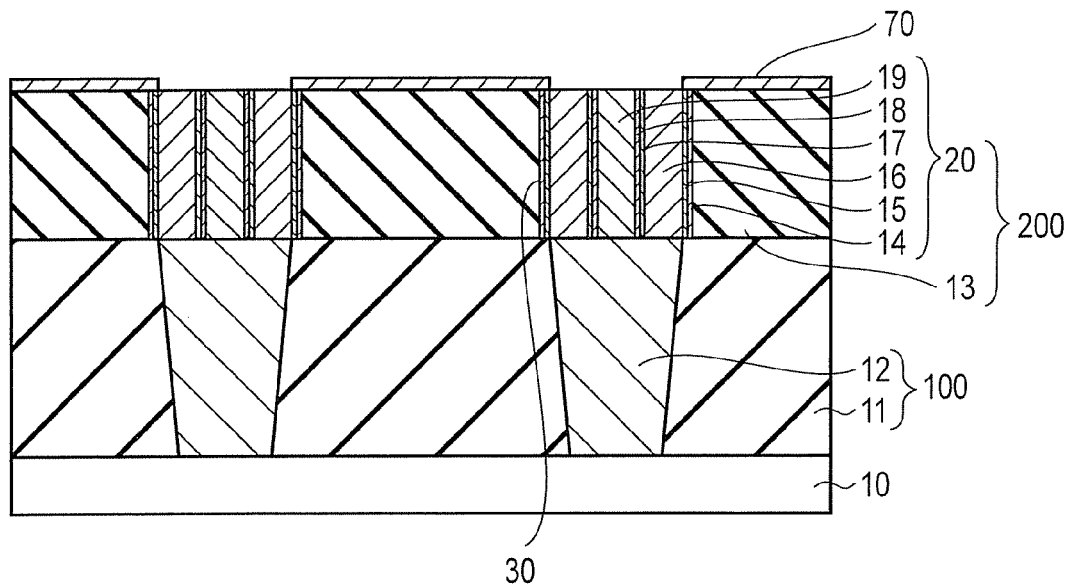
FIGS. 7A-8B are sectional views showing manufacturing steps in a modification of the graphene interconnection according to the first embodiment.

As shown in FIG. 7A, when forming the first graphene layers 16 or second graphene layer 19, a graphene byproduct 70 is formed on an interconnection layer insulating film 13 on the upper surface outside interconnection trenches 30. The graphene byproduct 70 is a carbon-based compound such as amorphous carbon. Therefore, the graphene byproduct 70 is conductive, and may cause a leakage current between interconnections.

Figure 7B:
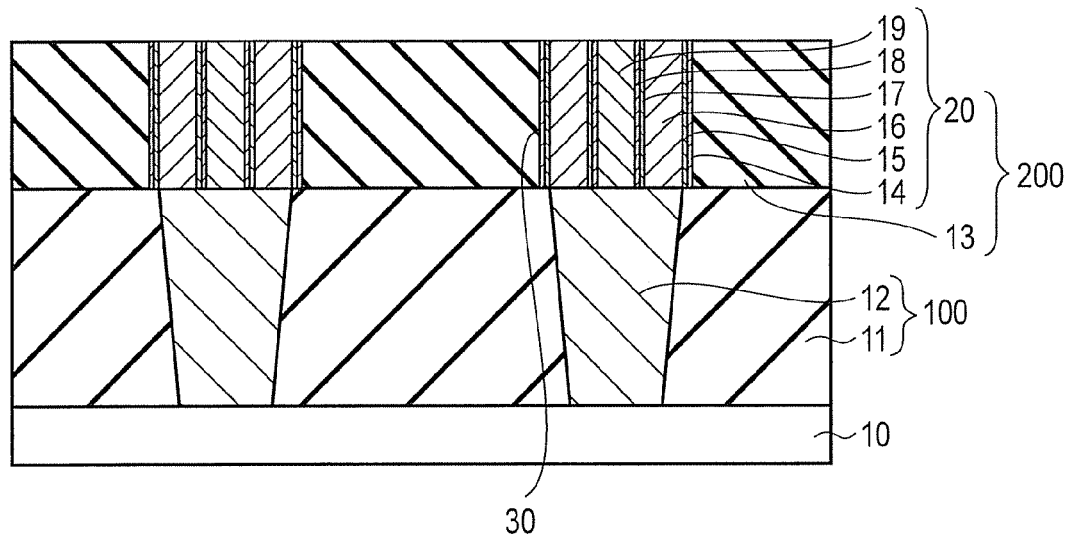

In this modification as shown in FIG. 7B, however, the graphene byproduct 70 formed on the interconnection layer insulating film 13 on the upper surface outside the interconnection trenches 30 is removed. This makes it possible to suppress the leakage current caused between interconnections by the graphene byproduct 70.

The removal of the graphene byproduct 70 is performed by, for example, CMP or RIE, and more preferably performed by RIE. This is so because when the upper end portions of the first graphene layers 16 and second graphene layer 19 are damaged by RIE, various band gaps are given to the first graphene layers 16 and second graphene layer 19, and this increases the contact margin with a second contact plug 23. That is, it is possible to use materials having various work functions as the contact material.

Note that the graphene byproduct 70 need not entirely be removed, and it is only necessary to partially remove the graphene byproduct 70 to make it discontinuous between interconnections. Also, the graphene byproduct 70 need not be removed if it is not a cause of the leakage current.

Figure 8A:
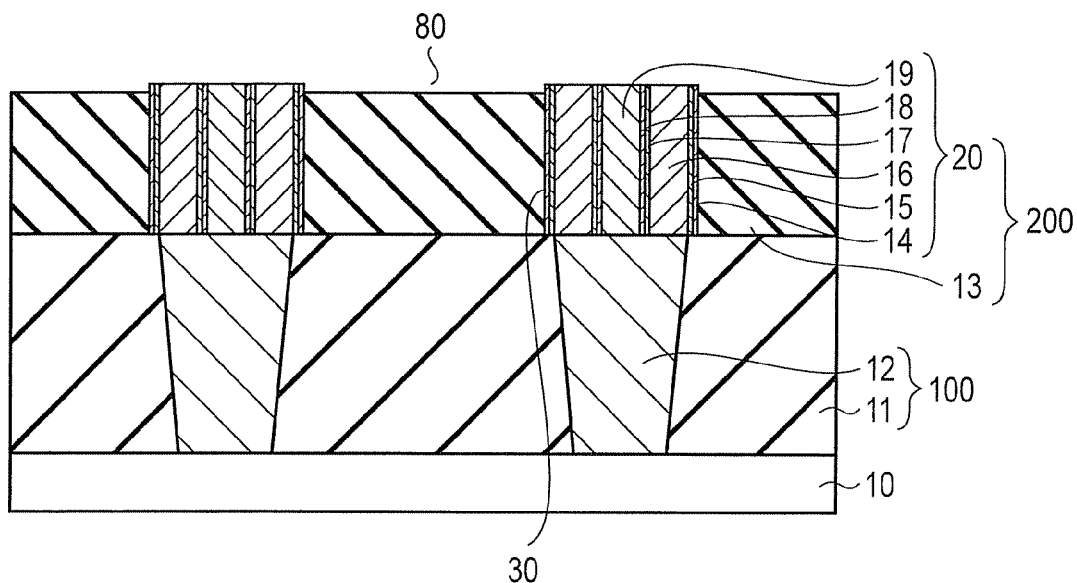

Furthermore, as shown in FIG. 8A, it is also possible to excessively remove the interconnection layer insulating film 13 by RIE. Consequently, the upper end portions of the interconnections 20 protrude from the upper surface of the interconnection layer insulating film 13. That is, the upper surface of the interconnection layer insulating film 13 becomes lower than the upper end portions of the interconnections 20, thereby forming a recess 80 between the interconnection layer insulating film 13 and interconnections 20. The recess 80 may also be formed by forming a sacrificial layer (not shown) on the interconnection layer insulating film 13, and removing this sacrificial layer. The graphene byproduct 70 can completely be removed by thus excessively removing the upper surface of the interconnection layer insulating film 13.

Figure 8B:
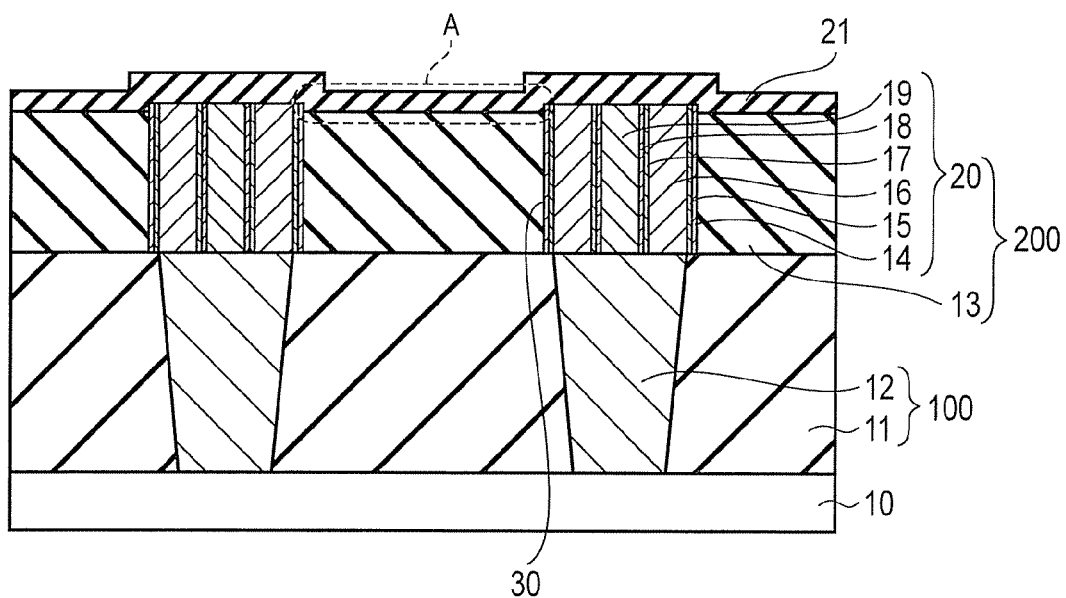

After that, as shown in FIG. 8B, a cap film 21 is formed on the entire surface. Since the recess 80 is formed, the cap film 21 is formed to cover the protruding upper end portions of the interconnections 20. In other words, a region A between the upper end portions of adjacent interconnections 20 is filled with the same insulating film (cap film 21).

Normally, the upper end portion of the interconnection 20 is made level with the upper surface of the interconnection layer insulating film 13. That is, an insulating film interface (for example, the interface between the interconnection layer insulating film 13 and cap film 21) exists on the upper end portion of the interconnection 20, and a leakage current is generated between interconnections along this interface. In this embodiment, however, an insulating film interface (for example, the interface between the interconnection layer insulating film 13 and cap film 21) does not exist in the region A between the upper end portions of adjacent interconnections 20, and the region A is filled with the same insulating film (cap film 21). This makes it possible to suppress the leakage current.

<Second Embodiment>

A graphene interconnection according to the second embodiment will be explained below with reference to FIGS. 9 and 10. In the first embodiment, a graphene interconnection is mainly applied to an element region. By contrast, the second embodiment is an example in which a graphene interconnection is applied to a peripheral circuit region. Note that in the second embodiment, an explanation of the same features as those of the first embodiment will be omitted, and differences will be explained.

[Structure]

FIG. 9 is a sectional view of the graphene interconnection according to the second embodiment.

As shown in FIG. 9, the second embodiment differs from the first embodiment in that an interconnection 20 in the peripheral circuit region includes a metal layer 91.

More specifically, the interconnection 20 in the peripheral circuit region is formed in an interconnection trench 90 wider than an interconnection trench 30 in the element region, and includes first catalyst underlying films 14, first catalyst films 15, first graphene layers 16, second catalyst underlying films 17, second catalyst films 18, second graphene layers 19, and the metal layer 91. Note that an interconnection 20 in the element region has the same structure as that of the first embodiment, so a repetitive explanation will be omitted.

In the peripheral circuit region, the first catalyst underlying films 14 are formed on only an interconnection layer insulating film 13 on the both side surfaces of the interconnection trench 90. The first catalyst films 15 are formed on only the first catalyst underlying films 14 on the both side surfaces of the interconnection trench 90. The first graphene layers 16 are formed on the first catalyst films 15 on the both side surfaces of the interconnection trench 90, and each include up to about 100 graphene sheets that grow by using the first catalyst film 15 as a catalyst. The second catalyst underlying films 17 are formed on only the first graphene layers 16 on the both side surfaces of the interconnection trench 90. The second catalyst films 18 are formed on only the second catalyst underlying films 17 on the both side surfaces of the interconnection trench 90. The second graphene layers 19 are formed on the second catalyst films 18 on the both side surfaces of the interconnection trench 90, and each include up to about 100 graphene sheets that grow by using the second catalyst film 18 as a catalyst.

The first catalyst underlying film 14, first catalyst film 15, first graphene layer 16, second catalyst underlying film 17, second catalyst film 18, and second graphene layer 19 in the peripheral circuit region respectively have film thicknesses equal to those of a first catalyst underlying film 14, first catalyst film 15, first graphene layer 16, second catalyst underlying film 17, second catalyst film 18, and second graphene layer 19 in the element region.

The metal layer 91 is formed on the second graphene layers 19 on the both side surfaces of the interconnection trench 90, and in the central portion of the interconnection trench 90. In other words, the metal layer 91 is buried in the central portion of the interconnection trench 90. The metal layer 91 is a metal such as W, Cu, or Al.

Note that in FIG. 9, a first contact plug 12 and second contact plug 23 are respectively connected to the lower and upper end portions of the metal layer 91. However, it is also possible to respectively connect the first contact plug 12 and second contact plug 23 to the lower and upper end portions of the first graphene layers 16 and second graphene layers 19.

[Manufacturing Method]

FIG. 10 is a sectional view of the manufacturing step of the graphene interconnection according to the second embodiment.

First, the manufacturing steps are performed up to the step shown in FIG. 6A of the first embodiment. That is, in the element region, an interconnection layer 200 including an interconnection 20 including first catalyst underlying films 14, first catalyst films 15, first graphene layers 16, second catalyst underlying films 17, second catalyst films 18, and a second graphene layer 19 is formed. In this step, an interconnection layer 200 is simultaneously formed in the peripheral circuit region as well.

AS shown in FIG. 10, however, the width of an interconnection trench 90 in the peripheral circuit region is larger than that of an interconnection trench 30 in the element region. Therefore, nothing is buried in the central portion of the interconnection trench 90 until the step of forming second graphene layers 19.

In this embodiment as shown in FIG. 9, however, a metal layer 91 is filled on second graphene layers 19 on the both side surfaces of the interconnection trench 90, and in the central portion of the interconnection trench 90. The metal layer 91 is formed by, for example, PVD or CVD.

After that, the metal layer 91 excessively formed on the upper surface outside the interconnection trench 90 in the peripheral circuit region and element region is removed, so the metal layer 91 remains in only the interconnection trench 90.

The rest of the steps are the same as those of the first embodiment, so a repetitive explanation will be omitted.

The above-mentioned second embodiment can achieve the same effects as those of the first embodiment.

In addition, in the second embodiment, the interconnection layer 200 in the peripheral circuit region is formed simultaneously with the interconnection layer 200 in the element region. After that, the metal layer 91 is filled in the central portion of the interconnection trench 90 in the peripheral circuit region. In the peripheral circuit region as described above, the width of the interconnection 20 is much larger than that in the element region, so a low-resistance interconnection can be formed by a normal metallic material without filling the interconnection trench 90 with the graphene layer. That is, the wide interconnection trench 90 in the peripheral circuit region need not be filled with any graphene layer, and need only be filled with the metal layer 91 midway along the process. This facilitates the process, and shortens the process time.

<Third Embodiment>

A graphene interconnection according to the third embodiment will be explained below with reference to FIGS. 11 and 12. The third embodiment is a modification of the second embodiment, and an example in which the central portion of an interconnection trench in a peripheral circuit region is filled with an insulating film. Note that in the third embodiment, an explanation of the same features as those of the above-mentioned embodiments will be omitted, and differences will be explained.

[Structure]

FIG. 11 is a sectional view of the graphene interconnection according to the third embodiment.

As shown in FIG. 11, the third embodiment differs from the second embodiment in that an interconnection 20 in the peripheral circuit region includes a plurality of graphene layers formed on one side surface of an interconnection trench 110.

More specifically, the interconnection 20 in the peripheral circuit region is formed in the interconnection trench 110 wider than an interconnection trench 30 in an element region, and includes a first catalyst underlying film 14, first catalyst film 15, first graphene layer 16, second catalyst underlying film 17, second catalyst film 18, and second graphene layer 19. Note that an interconnection 20 in the element region has the same structure as that of the first embodiment, so a repetitive explanation will be omitted.

In the peripheral circuit region, the first catalyst underlying film 14 is formed on only an interconnection layer insulating film 13 on one side surface of the interconnection trench 110. The first catalyst film 15 is formed on only the first catalyst underlying film 14 on one side surface of the interconnection trench 110. The first graphene layer 16 is formed on the first catalyst film 15 on one side surface of the interconnection trench 110, and includes up to about 100 graphene sheets that grow by using the first catalyst film 15 as a catalyst. The second catalyst underlying film 17 is formed on only the first graphene layer 16 on one side surface of the interconnection trench 110. The second catalyst film 18 is formed on only the second catalyst underlying film 17 on one side surface of the interconnection trench 110. The second graphene layer 19 is formed on the catalyst film 18 on one side surface of the interconnection trench 110, and includes up to about 100 graphene sheets that glow by using the second catalyst film 18 as a catalyst.

The lower and upper end portions of the interconnection 20 (graphene layers) formed on one side surface of the interconnection trench 110 are respectively connected to a first contact plug 12 and second contact plug 23.

On the other hand, a dummy interconnection 20' is formed on the other side surface of the interconnection trench 110. The dummy interconnection 20' has the same structure (a mirror symmetrical structure) as that of the interconnection 20 formed on one side surface of the interconnection trench 110. That is, the dummy interconnection 20' includes a first catalyst underlying film 14', first catalyst film 15', first graphene layer 16', second catalyst underlying film 17', second catalyst film 18', and second graphene layer 19' sequentially formed on the interconnection layer insulating film 13 on the other side surface of the interconnection trench 110.

A second contact layer insulating film 22 and cap film 21 are filled between the interconnection 20 and dummy interconnection 20', i.e., in the central portion of the interconnection trench 110.

[Manufacturing Method]

FIG. 12 is a sectional view of the manufacturing step of the graphene interconnection according to the third embodiment.

First, the manufacturing steps are performed up to the step shown in FIG. 6A of the first embodiment. That is, in the element region, an interconnection layer 200 including an interconnection 20 including first catalyst underlying films 14, first catalyst films 15, first graphene layers 16, second catalyst underlying films 17, second catalyst films 18, and a second graphene layer 19 is formed.

In this step, an interconnection layer 200 is simultaneously formed in the peripheral circuit region as well. That is, an interconnection 20 and dummy interconnection 20' are formed in the peripheral circuit region. In the peripheral circuit region, an interconnection trench 110 is formed such that a first contact plug 12 is exposed to one end portion (one side surface) of the interconnection trench 110. Consequently, the lower end portion of the interconnection 20 (graphene layers) formed on one side surface of the interconnection trench 110 is directly connected to the first contact plug 12.

As shown in FIG. 12, however, the width of the interconnection trench 110 in the peripheral circuit region is larger than that of an interconnection trench 30 in the element region. Therefore, nothing is buried in the central portion of the interconnection trench 110 before the step of forming a second graphene layer 19 (second graphene layer 19').

In this embodiment as shown in FIG. 11, however, a cap film 21 and second contact layer insulating film 22 are then formed on the entire surface, and filled between the interconnection 20 and dummy interconnection 20', i.e., in the central portion of the interconnection trench 110.

The rest of the manufacturing steps are the same as those of the first embodiment, so a repetitive explanation will be omitted.

The above-mentioned third embodiment can achieve the same effects as those of the second embodiment.

In addition, the third embodiment differs from the second embodiment in that the interconnection trench 110 is filled by forming the cap film 21 and second contact layer insulating film 22 without filling the metal layer 91. This facilitates the process, and shortens the process time.

Also, not only the interconnection 20 but also the dummy interconnection 20' having the same structure as that of the interconnection 20 is formed in the peripheral circuit region. Since the dummy interconnection 20' having the same structure as that of the interconnection 20 is thus formed near it, it is easy to balance the CMP rate of CMP to be performed later, and the flatness of CMP improves.

<Fourth Embodiment>

A graphene interconnection according to the fourth embodiment will be explained below with reference to FIGS. 13, 14A, and 14B. The fourth embodiment is an example in which an interconnection 20 has projections and recesses in the upper and lower end portions. Note that in the fourth embodiment, an explanation of the same features as those of the above-mentioned first embodiment will be omitted, and differences will be explained.

[Structure]

FIG. 13 is a sectional view of the graphene interconnection according to the fourth embodiment.

As shown in FIG. 13, the fourth embodiment differs from the first embodiment in that the upper and lower end portions of the interconnection 20 are rounded and stepped.

More specifically, the upper and lower end portions of the interconnection 20 are rounded and stepped, and hence become lower from the side surfaces toward the central portion of an interconnection trench 30. The roundness occurs on the entire surfaces of the upper and lower end portions of first catalyst underlying films 14, first catalyst films 15, first graphene layers 16, second catalyst underlying films 17, second catalyst films 18, and a second graphene layer 19. Also, the steps are formed in the interface between the first catalyst underlying film 14 and first catalyst film 15, the interface between the first graphene layer 16 and second catalyst underlying film 17, and the interface between the second catalyst underlying film 17 and second catalyst film 18. These steps are formed by the control of RIE when processing the first catalyst underlying films 14, first catalyst films 15, second catalyst underlying films 17, and second catalyst films 18 in a manufacturing step to be described later.

[Manufacturing Method]

FIGS. 14A and 14B are sectional views of the manufacturing steps of the graphene interconnection according to the fourth embodiment.

First, the manufacturing steps are performed up to the step shown in FIG. 3B of the first embodiment. That is, a first catalyst underlying film 14 is formed on the entire surface by, for example, CVD or PVD.

Then, as shown in FIG. 14A, etch back is performed by highly translational (anisotropic) RIE. Consequently, the first catalyst underlying film 14 on the bottom surfaces of interconnection trenches 30 and the upper surface outside the interconnection trenches 30 is etched back. That is, the first catalyst underlying film 14 is removed from the bottom surfaces of the interconnection trenches 30 and the upper surface outside the interconnection trenches 30, and left behind on only the both side surfaces of each interconnection trench 30.

In this step, etch back by RIE is excessively performed. Consequently, the bottom surface of each interconnection trench 30 is etched back. Since the central portion of the bottom surface of the interconnection trench 30 is particularly excessively etched back, the bottom surface is rounded and becomes lower from the side surfaces toward the central portion. That is, the upper surface of a first contact plug 12 is given a rounded shape that becomes lower from the side surfaces toward the central portion.

After that, a first catalyst film 15 is formed by, for example, CVD, PVD, or spraying, and etched back by highly translational (anisotropic) RIE. Consequently, the first catalyst film 15 on the bottom surfaces of the interconnection trenches 30 and the upper surface outside the interconnection trenches 30 is etched back. That is, the first catalyst film 15 is removed from the bottom surfaces of the interconnection trenches 30 and the upper surface outside the interconnection trenches 30, and left behind on only the both side surfaces of each interconnection trench 30.

In this step, as in the same manner as for the first catalyst underlying film 14, etch back by RIE is excessively performed, so the bottom surface of each interconnection trench 30 is further etched back. Consequently, the bottom surface of the interconnection trench 30 is further rounded and becomes lower from the side surfaces toward the central portion.

Then, as shown in FIG. 14B, first graphene layers 16 each including up to about 100 graphene sheets are formed on the first catalyst films 15 on the both side surfaces of each interconnection trench 30. The first graphene layers 16 are formed such that the lower end portions of the surfaces of the plurality of graphene sheets are directly connected to the first contact plug 12.

After that, the above-mentioned steps are repetitively performed as shown in FIG. 13.

More specifically, a second catalyst underlying film 17 is first formed on the entire surface by, for example, CVD or PVD, and etched back by highly translational (anisotropic) RIE. In addition, a second catalyst film 18 is formed on the entire surface by, for example, CVD, PVD, or spraying, and etched back by highly translational (anisotropic) RIE. As described above, it is desirable to appropriately excessively perform each etch back process. The upper surface of the first contact plug 12 is rounded and stepped by thus excessively performing the etch back process.

Note that after the first catalyst underlying film 14 and first catalyst film 15 are formed, it is also possible to simultaneously remove the first catalyst underlying film 14 and first catalyst film 15 from the bottom surfaces of the interconnection trenches 30 and the upper surface outside the interconnection trenches 30. Likewise, after the second catalyst underlying film 17 and second catalyst film 18 are formed, it is also possible to simultaneously remove the second catalyst underlying film 17 and second catalyst film 18 from the bottom surfaces of the interconnection trenches 30 and the upper surface outside the interconnection trenches 30.

Subsequently, a second graphene layer 19 including up to about 100 graphene sheets is formed on the second catalyst films 18 on the both side surfaces of each interconnection trench 30. The second graphene layer 19 is formed such that the lower end portions of the surfaces of the plurality of graphene sheets are directly connected to the first contact plug 12 whose upper surface has the rounded or stepped shape.

Thus, an interconnection layer 200 including interconnections 20 each including the first catalyst underlying films 14, first catalyst films 15, first graphene layers 16, second catalyst underlying films 17, second catalyst films 18, and second graphene layer 19 is formed. The interconnection 20 has the rounded or stepped shape not only in the lower end portion but also in the upper end portion.

After that, a second contact layer 300 is formed on the interconnection layer 200. In this step, the second contact layer 300 is formed such that the lower surface of each second contact plug 23 is directly connected to the interconnection 20 having the rounded or stepped shape in the upper end portion.

The above-mentioned fourth embodiment can achieve the same effects as those of the first embodiment.

In addition, in the fourth embodiment, the lower and upper end portions of the interconnection 20 are rounded. This makes it possible to increase the contact area by which the first catalyst underlying film 14, first catalyst film 15, second catalyst underlying film 17, and second catalyst film 18 of the interconnection 20 come in contact with the first contact plug 12 and second contact plug 23, thereby reducing the contact resistance.

In the first graphene layer 16 and second graphene layer 19, the end portions of the surfaces of the plurality of graphene sheets may not be formed at the same height. If this is the case, there is a graphene sheet not directly connected to the first contact plug 12 and second contact plug 23.

In this embodiment, however, the lower and upper end portions of the interconnection 20 are rounded or stepped. This increases the possibility that a graphene sheet not to be directly connected to the first contact plug 12 and second contact plug 23 is directly connected to them. Accordingly, the number of graphene sheets directly connected to the first contact plug 12 and second contact plug 23 increases, and a low-resistance interconnection structure can be implemented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A graphene interconnection comprising:
    a substrate having a major surface;
    a first insulating film provided above the major surface of the substrate, and including an interconnection trench;
    a first catalyst film formed on the first insulating film on both side surfaces of the interconnection trench;
    a first graphene layer formed on the first catalyst film on the both side surfaces of the interconnection trench, and the first graphene layer including graphene sheets stacked in a direction non-parallel to the both side surfaces, wherein the graphene sheets are on the both side surfaces of the interconnection trench; and
    a first contact plug electrically connected to the first graphene layer, wherein opposing end portions of at least one of the graphene sheets that is on the both side surfaces of the interconnection trench is directly in contact with the first contact plug and a second contact plug, respectively.

2. The interconnection of claim 1, further comprising:
    a second catalyst film formed on the first graphene layer on the both side surfaces of the interconnection trench; and
    a second graphene layer formed on the second catalyst film on the both side surfaces of the interconnection trench, and including a plurality of graphene sheets stacked in a direction non-parallel to the both side surfaces.

3. The interconnection of claim 1, wherein one of an upper end portion and a lower end portion of the first catalyst film is directly contact with the first contact plug.

4. The interconnection of claim 1, further comprising a first catalyst underlying film formed between the first insulating film and the first catalyst film on the both side surfaces of the interconnection trench,
    wherein one of an upper end portion and a lower end portion of the first catalyst underlying film is directly contact with the first contact plug.

5. The interconnection of claim 1, wherein the first graphene layer comprises up to about 100 graphene sheets stacked in a direction non-parallel to the both side surfaces.

6. The interconnection of claim 1, wherein the first catalyst film comprises a continuous film.

7. The interconnection of claim 5, wherein a film thickness of the first catalyst film is not less than 0.5 nm.

8. The interconnection of claim 1, wherein upper end portions of the first catalyst film and the first graphene layer protrude from the interconnection trench.

9. The interconnection of claim 8, further comprising a cap film formed on the first insulating film, and having a lower surface lower than the upper end portions of the first catalyst film and the first graphene layer, and an upper surface higher than the upper end portions of the first catalyst film and the first graphene layer.

10. The interconnection of claim 1, further comprising a second insulating film formed on the first graphene layer on the both side surfaces of the interconnection trench, and filling a central portion of the interconnection trench.

11. The interconnection of claim 1, wherein upper end portions and lower end portions of the first catalyst film and the first graphene layer are rounded and stepped.

12. The interconnection of claim 1, wherein
    the second contact plug electrically connected to the first graphene layer.

* * * * *